United States Patent [19]
Nakano

[11] Patent Number: 6,147,556
[45] Date of Patent: Nov. 14, 2000

[54] SOLID-STATE IMAGE SENSOR

[75] Inventor: Takashi Nakano, Tokyo, Japan

[73] Assignee: NEC Corporation, Tokyo, Japan

[21] Appl. No.: 09/185,547

[22] Filed: Nov. 4, 1998

[30] Foreign Application Priority Data

Nov. 4, 1997 [JP] Japan ................................. 9-301700

[51] Int. Cl.[7] .................................................. H03F 3/16
[52] U.S. Cl. .......................................... 330/277; 330/310
[58] Field of Search ................................... 330/277, 310, 330/307

[56] References Cited

U.S. PATENT DOCUMENTS

| | | | |
|---|---|---|---|
| 3,900,790 | 8/1975 | Ohsawa | 330/310 |
| 3,968,452 | 7/1976 | Sahara et al. | 330/310 |
| 4,987,382 | 1/1991 | Saitoh | 330/277 |
| 5,376,898 | 12/1994 | Tanaka et al. | 330/277 |
| 5,589,799 | 12/1996 | Madaffari et al. | 330/277 |
| 5,825,249 | 10/1998 | Nakano | 330/277 |
| 5,905,256 | 5/1999 | Nakano | 330/308 |
| 6,023,195 | 2/2000 | Nakano et al. | 330/307 |

FOREIGN PATENT DOCUMENTS

| | | |
|---|---|---|
| 60-223161 | 11/1985 | Japan . |
| 5-191735 | 7/1993 | Japan . |
| 7-273568 | 10/1995 | Japan . |

*Primary Examiner*—Robert Pascal
*Assistant Examiner*—Khanh Van Nguyen
*Attorney, Agent, or Firm*—McGinn & Gibb, P.C

[57] ABSTRACT

The present invention provides a solid-state image sensor comprising a source follower amplifier on a single chip capable of preventing a gain loss caused by a back gate effect.

In the solid-state image sensor including multi-stage single-chip source follower amplifier, one stage of the multi-stage source follower amplifier has a load transistor 5 whose source and gate are connected to an output signal 3 via a capacitor 7, and a DC voltage 6 is applied via a resistor 8 having a high resistance.

23 Claims, 7 Drawing Sheets

SOLID-STATE IMAGE SENSOR

BACKGROUND OF THE INVENTION

1. Field of the Invention

The present invention relates to a solid-state image sensor and in particular to an output block of a solid-state image sensor.

2. Description of the Related Art

FIG. 9 is a circuit diagram equivalent to a source follower amplifier provided on a single chip in a conventional typical solid-state image sensor. As shown in FIG. 9, in the single-chip source follower amplifier of the conventional solid-state image sensor, a back gate is electrically open with respect to a driver transistor source.

Japanese Patent Publication (Unexamined) No. A-60-223161 [1] discloses means for enhancing the gain of the single-chip source follower amplifier for such a conventional solid-state image sensor output block.

FIG. 10A is a cross sectional view of a solid-state image sensor disclosed in the aforementioned Document [1], and FIG. 10B shows a circuit equivalent to a single-chip source follower amplifier of the solid-state image sensor.

As shown in FIG. 10B, components of the solid-state image sensor excluding a driver transistor 4 are formed in a first reverse-conductive region 17 having a reverse conductivity with respect to a semiconductor substrate 11 having a first conductivity, whereas the driver transistor 4 is formed in a second reverse-conductive region 18 which is independent from the first reverse-conductive region. Furthermore, the second reverse-conductive region 18 is connected to a source 19 of the driver transistor 4.

If it is assumed that the driver transistor has an interactive conductance gm, the back gate (second reverse-conductive region 18) has a conductance gmb, the driver transistor has an output conductance gds1, and the load transistor has an output conductance gds2, then the source follower amplifier has a gain G which can be expressed by equation (1) as follows.

$$G = gm/(gm+gmb+bds1+gds2) \quad (1)$$

Therefore, if the back gate is connected to the source of the driver transistor, then gmb=0, enabling to increase the gain G.

In addition to the disclosure in Document [1], various techniques have been suggested as the solid-state image sensor output method.

For example, Japanese Patent Publication (Unexamined) No. A-5-191735 [2] discloses a CCD type solid-state image sensor in which a source voltage obtained by providing a self-bias resistor in a load MOS FET of a source follower circuit is feedback-ed via a feedback amplifier to a gate of the load MOS FET so as to increase the gain.

Japanese Patent Publication (Unexamined) No. A-7-273568 [3] discloses a voltage circuit including a MOS transistor having a back gate and a source which are independent from each other so as to obtain a high impedance between them, thus enabling to eliminate affects from a parasitic capacitance as well as to drive with the back gate potential and source potential at an identical value so as to eliminate the substrate bias effect.

However, in the solid-state image sensor (see FIG. 10) disclosed in Document [1], the semiconductor substrate 11 is N type, and the reverse-conductive regions 17 and 18 are P type. Moreover, a source voltage 2 of the source follower amplifier is 15 V. Accordingly, a voltage in the order of about 15 V has been applied to the semiconductor substrate 11. However, with the tendency to reduce the voltage, currently a voltage in the order of about 5 V is applied. It should be noted that the first reverse-conductive region 17 has a potential 0V, whereas the second reverse-conductive region 18 connected to the driver transistor source 19 has a potential of about 8 V.

There is no problem while 15 V is applied to the semiconductor substrate 11. However, when a voltage applied to the semiconductor substrate 11 is in the order of 5 V, the P-type second reverse-conductive region 18 and the N-type semiconductor substrate 11 constitute a forward bias, disabling the operation as the solid-state image sensor.

Moreover, the second reverse-conductive region 18 is formed to be isolated from the first reverse-conductive regions 17. This results in a large area of the driver transistor portion, which is a disadvantage in reducing the size and weight of the solid-state image sensor.

Moreover, in the solid-state image sensor disclosed in Document [3], it is necessary to reverse an output for feedback to the gate. For this, it is necessary to provide an output reversing circuit, complicating the configuration of the solid-state image sensor.

Moreover, in the voltage circuit disclosed in Document [3], when applying a voltage to a back gate on a single chip, the back gate need be electrically isolated from the other back gate. Thus, the voltage circuit disclosed here has a problem that the transistor need to have a large area for applying a voltage to the back gate.

SUMMARY OF THE INVENTION

It is therefore an object of the present invention to provide a solid-state image sensor enabling the prevention of a loss of gain due to a back gate effect of a source follower amplifier on a single chip without providing an additional circuit and to obtain high gain while reducing the size and weight of the solid-state image sensor.

In order to achieve the aforementioned object, the solid-state image sensor according to the present invention comprises a single-stage or multi-stage source follower amplifier, each stage having at least one load transistor and one driver transistor, on a single chip, wherein a DC voltage is applied to a source or a source and gate of the load transistor in the single-stage source follower amplifier, or to a source or a source and gate of at least one source follower in the multi-stage source follower amplifier, and an output signal from the single-stage source follower amplifier or an output signal from the multi-stage source follower amplifier is applied via a capacitor.

According to another aspect of the present invention, there is provided a solid-state image sensor including a multi-stage source follower amplifier, each stage having at least one load transistor and at least one driver transistor, on a single chip, wherein a source follower amplifier of at least one stage has a load transistor whose source and gate are connected via a capacitor to an output terminal of the multistage source follower amplifier, and at least one of remaining source follower amplifiers has a load transistor whose source is connected via the capacitor to the output terminal, so that a DC voltage is applied to a gate of the load transistor.

According to still another aspect of the present invention, there is provided a solid-state image sensor comprising a single-stage or multi-stage source follower amplifier, each stage having at least one load transistor and one driver transistor, on a single chip, wherein an output signal from the single-stage source follower amplifier or an output signal from the multi-stage source follower amplifier is applied via a single-stage buffer amplifier or a multi-stage buffer amplifier to a source or a source and gate of the load transistor in the single-stage source follower amplifier, or to a source or a source and gate of at least one source follower in the multi-stage source follower amplifier.

According to yet another aspect of the present invention, there is provided a solid-state image sensor including a multi-stage source follower amplifier, each state having at least one load transistor and at least one driver transistor, on a single chip, wherein a source follower amplifier of at least one stage has a load transistor whose source and gate are connected via a single-stage buffer amplifier or a multi-stage buffer amplifier to an output terminal of the multistage source follower amplifier, and at least one of remaining source follower amplifiers has a load transistor whose source is connected via the single-stage buffer amplifier or the multi-stage buffer amplifier to the output terminal, so that a DC voltage is applied to a gate of the load transistor.

According to yet still another aspect of the present invention, there is provided a solid-state image sensor comprising a single stage or multi-stage source follower amplifier, each stage having at least one load transistor and one driver transistor, on a single chip, wherein a DC voltage is applied to a source or a source and gate of the load transistor in the single-stage source follower amplifier, or to a source or a source and gate of at least one source follower in the multi-stage source follower amplifier, and an output signal from the single-stage source follower amplifier or an output signal from the multi-stage source follower amplifier is applied via a capacitor and a single-stage buffer amplifier or a multi-stage buffer amplifier.

According to still yet another aspect of the present invention, there is provided a solid-state image sensor including a multi-stage source follower amplifier, each state having at least one load transistor and at least one driver transistor, on a single chip, wherein a source follower amplifier of at least one stage has a load transistor whose source and gate are connected via a capacitor to an output terminal of the multistage source follower amplifier, and at least one of remaining source follower amplifiers has a load transistor whose source is connected via the capacitor and a single-stage buffer amplifier or a multi-stage buffer amplifier to the output terminal, so that a DC voltage is applied to a gate of the load transistor.

It is preferable that the DC voltage be applied via a resistor having a high resistance. The resistor may be provided either on the same chip or out of the chip.

Similarly, the capacitor may be provided either on the same chip or out of the chip.

Similarly, the single-stage buffer amplifier or the multi-stage buffer amplifier may be provided either on the same chip or out of the chip.

Some explanation will be given on the function of the solid-state image sensor according to the present invention.

The solid-state image sensor includes a source follower amplifier constituted by a plurality of transistors, each of which is designed to operate in a saturated region. Accordingly, each of the transistors has a current value. I expressed by equation (2) below, assuming $\mu$ for a movement, Cox for the oxide film capacity, W for the gate effective width, L for the gate effective length, Vg for the gate voltage, Vs for the source voltage, and Vt for the threshold voltage.

$$I = \mu \times Cox \times W/L \times (Vg-Vs-Vt)^2 \quad (2)$$

Here, for simplification of the explanation, a load transistor is assumed to be an ideal constant current source.

In the source follower amplifier, when an input voltage Vg of a driver transistor is increased, the source voltage Vs is also increased so as to make constant the value of (Vg−Vs−Vt). Here, if it is assumed that there is no fluctuation of the threshold voltage Vt due to the substrate bias effect, the increase of the gate voltage Vg is identical to the increase of the source voltage Vs, increasing the gain. Actually, however, as the source voltage Vs increases, the substrate bias effect increases, which in turn increases the threshold voltage Vt. Accordingly, when using a constant current source as the load transistor, the increase of the threshold voltage Vt increases the difference (Vg−Vs) between the gate voltage and the source voltage. That is, the increase of the gate voltage Vg does not result in a corresponding increase of the source voltage Vs. This results in decrease of the gain.

In a conventional example, the substrate bias effect of the driver transistor is eliminated to increase the gain. However, even without eliminating the substrate bias effect of the driver transistor, the gain decrease can be prevented by decreasing the current of the load transistor corresponding to a current decrease caused by the increase of the threshold voltage Vt based on the substrate bias effect of the driver transistor. In this case, the current decrease of the load transistor need not be matched with the current decrease of the driver transistor. If the current decrease of the load transistor is set greater than the current decrease of the driver transistor, it is possible to further increase the gain of the source follower amplifier.

More specifically, an output signal of the source follower amplifier is fed to a capacitor where its AC component is removed before being supplied to the load transistor gate and source. Furthermore, a DC bias is applied to the load transistor gate and source via a resistor having a high resistance. Thus, it is possible to regulate the load transistor gate and source at a desired voltage, enabling the application of the substrate bias effect of an identical level to the load transistor as to the driver transistor.

Moreover, it is possible to increase the gain of the source follower amplifier more than by just removing the substrate bias effect of the driver transistor, if an AC component is removed with a capacitor from the output signal of the source follower amplifier before being supplied only to the load transistor source, to which a DC bias is applied via a resistor having a high resistance, so as to regulate the load transistor source at a desired voltage, and if another DC bias is applied to the load transistor gate.

Moreover, it is possible to increase the gain of the source follower amplifier by applying a single-stage or a multi-stage buffer amplifier to an output signal of the source follower amplifier so as to regulate a DC voltage of the output signal at a desired voltage to be applied to the gate or both of the gate and source of the load transistor.

DESCRIPTION OF THE PREFERRED EMBODIMENTS

A description will now be provided for preferred embodiments of the present invention with reference to the attached drawings.

Figure 1A:
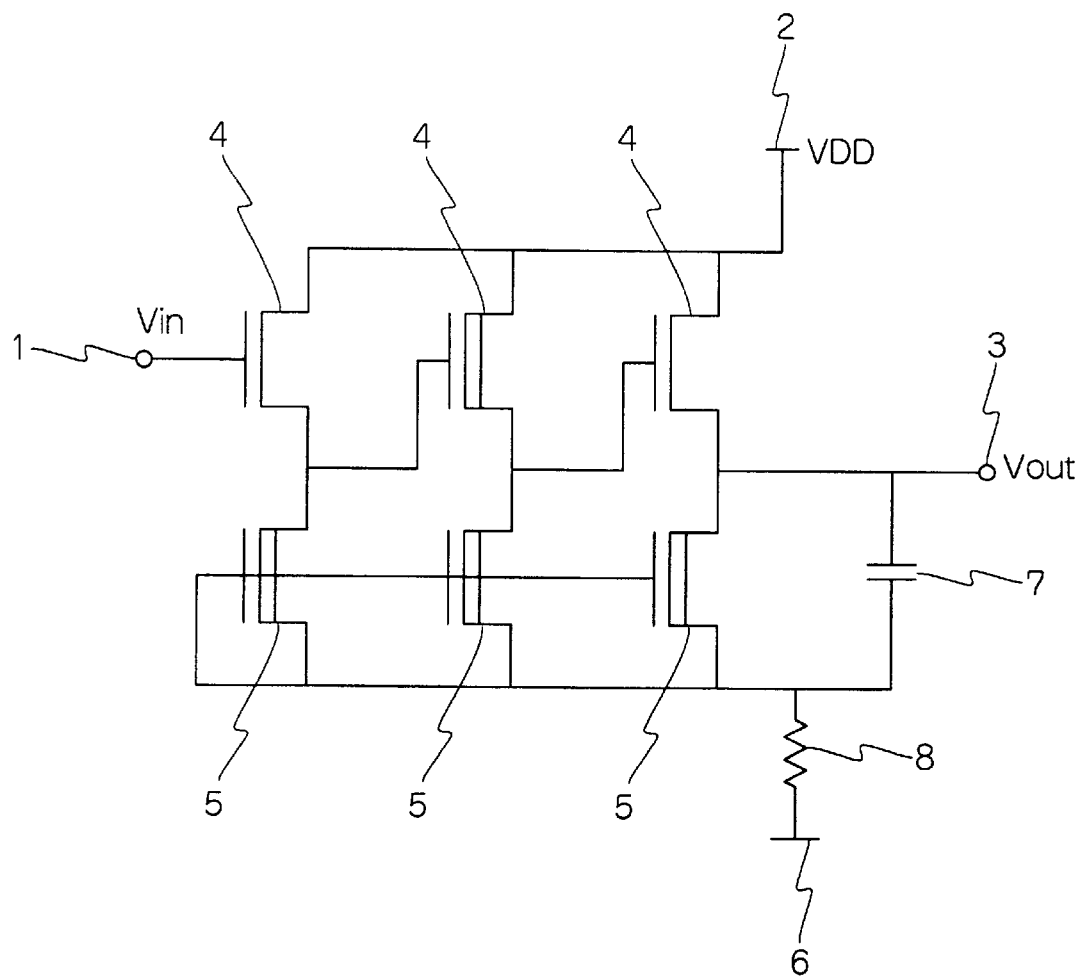
FIG. 1A shows an equivalent circuit of an amplifier in a solid-state image sensor according to a first embodiment of the present invention.
Figure 1B:
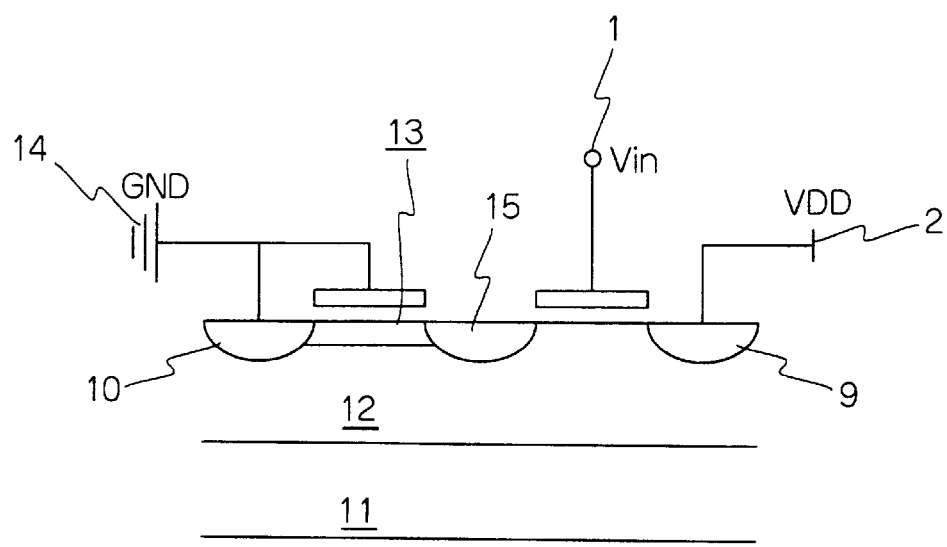
FIG. 1B is cross sectional view of the equivalent circuit.

FIG. 1 shows a 3-stage source follower amplifier on a single chip as a solid-state image sensor amplifier according to a first embodiment of the present invention. FIG. 1A shows an equivalent circuit of the 3-stage follower amplifier and FIG. 1B is a cross sectional view showing the 3-stage follower amplifier.

The 3-stage source follower amplifier uses six transistors serving as N channels, three driver transistors 4 at an upper stage and three load transistors 5 at a lower stage. The three driver transistors 4 have drains connected to a power voltage VDD2 and sources connected to drains of the load transistors 5 as well as to gates of the driver transistors 4 of a following stage, excluding the last stage which is connected not to the gate of the driver transistor 4 but to an output terminal 3 which is connected to an external circuit (not depicted). Moreover, the driver transistor 4 of the first stage has a gate connected to an input terminal 1.

Moreover, the output terminal 3 of the last stage is connected via a capacitor 7 to both of the sources and gates of the load transistors 5 of all the stages. The sources and gates of the load transistors 5 are connected via a high-resistance resistor 8 to a DC power source 6.

FIG. 1B is a cross sectional view of the third-stage source follower amplifier of the single-chip three-stage source follower amplifier shown in FIG. 1A. The first-stage driver transistor 4 and the third-stage driver transistor 4 are of a surface type having channels formed in the P type region 12 as shown in a right half of FIG. 1B. The other four transistors are of buried type having channels in an N type region formed above the P type region 12 as shown in a left half of FIG. 1B.

For simplification of a production process, the surface type transistors have an identical configuration excluding the gate length and the gate width. Similarly, the bury type transistors have an identical configuration excluding the gate length and the gate width. The gate insulation film is formed from a single silicone oxide or a silicon oxide film sandwiching a silicon nitride film.

The gate electrode is made from a polycrystalline silicon containing N-type impurities such as phosphorous dispersed so as to reduce resistance to a level like a metal. The diffusion layers including source 10, drain 9, and source-drain 15 are formed by doping N-type impurities such as phosphorous. The drain 9 is connected to the power voltage VDD2, and the source 10 is connected to a grounding 14.

The ion implantation is performed for both of the P type region and the N type region, with a voltage of several hundreds keV and concentration in the order of $1 \times 10^{-2}$. Moreover, the gate length and the gate width of each of the transistors are determined so as to satisfy the designed values including the gain and the frequency band.

Figure 2A:
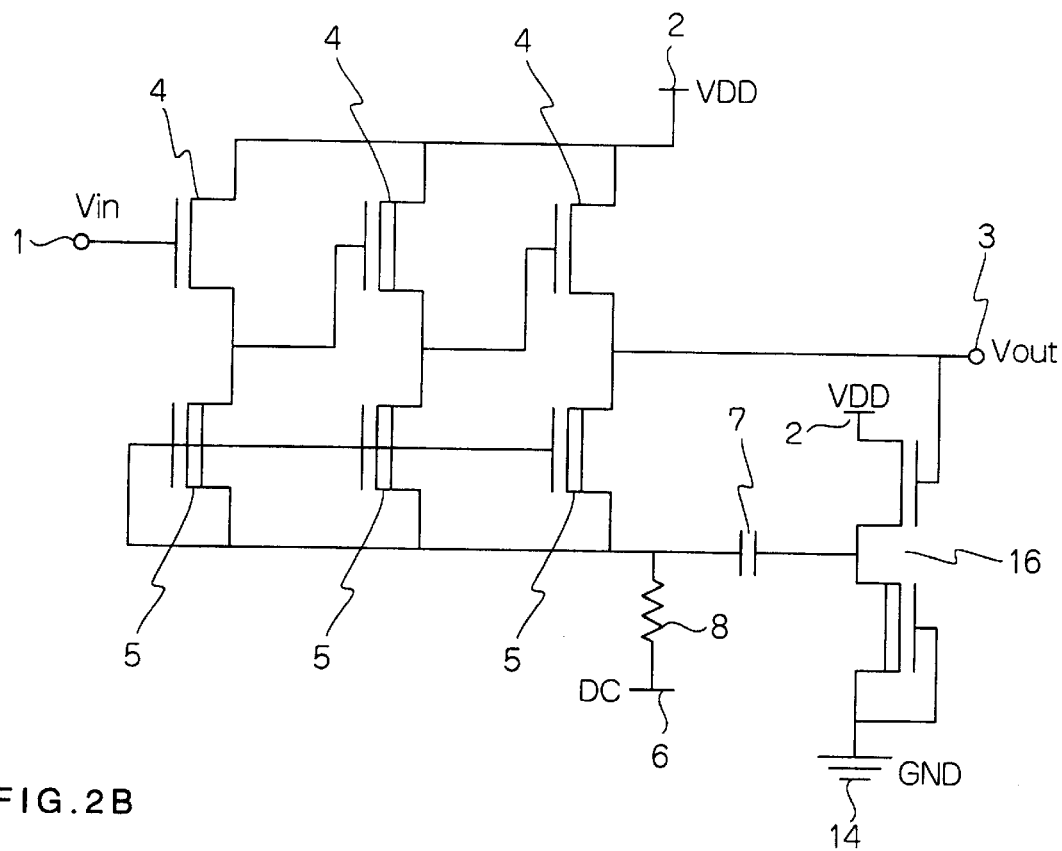
FIG. 2A shows an equivalent circuit of an amplifier in a solid-state image sensor according to a second embodiment of the present invention.

FIG. 2A shows an equivalent circuit of a solid-state image sensor amplifier according to a second embodiment of the present invention.

The solid-state image sensor amplifier according to the second embodiment has an almost identical configuration as the solid-state image sensor amplifier according to the first embodiment except for that a buffer amplifier 16 of one or more stages is provided between the output terminal 3 and the capacitor 7. That is, in the solid-state image sensor amplifier according to the second embodiment, the output terminal 3 is connected via the buffer 16 of one or more stages and the capacitor 7 to the source and gate, or to the source of the load transistors 5.

If buffer amplifier 16 is not provided, the capacitor 7 causes a load to the source follower connecting the output terminal 3 to the load transistors 5, and the source follower has an output signal level decreased. Thus, the buffer amplifier 16 functions to prevent decrease of the source follower output.

FIG. 3B shows an equivalent circuit of a solid-state image sensor amplifier according to a third embodiment of the present invention.

The solid-state image sensor amplifier according to the third embodiment has an almost identical configuration as the solid-state image sensor amplifier of the second embodiment except for that in the solid-state image sensor amplifier of the third embodiment, the output terminal 3 is connected via the buffer amplifier 16 of one or more stages alone to the source and gate, or the source of the load transistor 5, not passing through the capacitor 7. In this case, the buffer amplifier 16 adjusts the DC voltage of the output terminal 3 to a desired value to be applied to the source and gate, or the source of the load transistors 5.

Figure 2B:
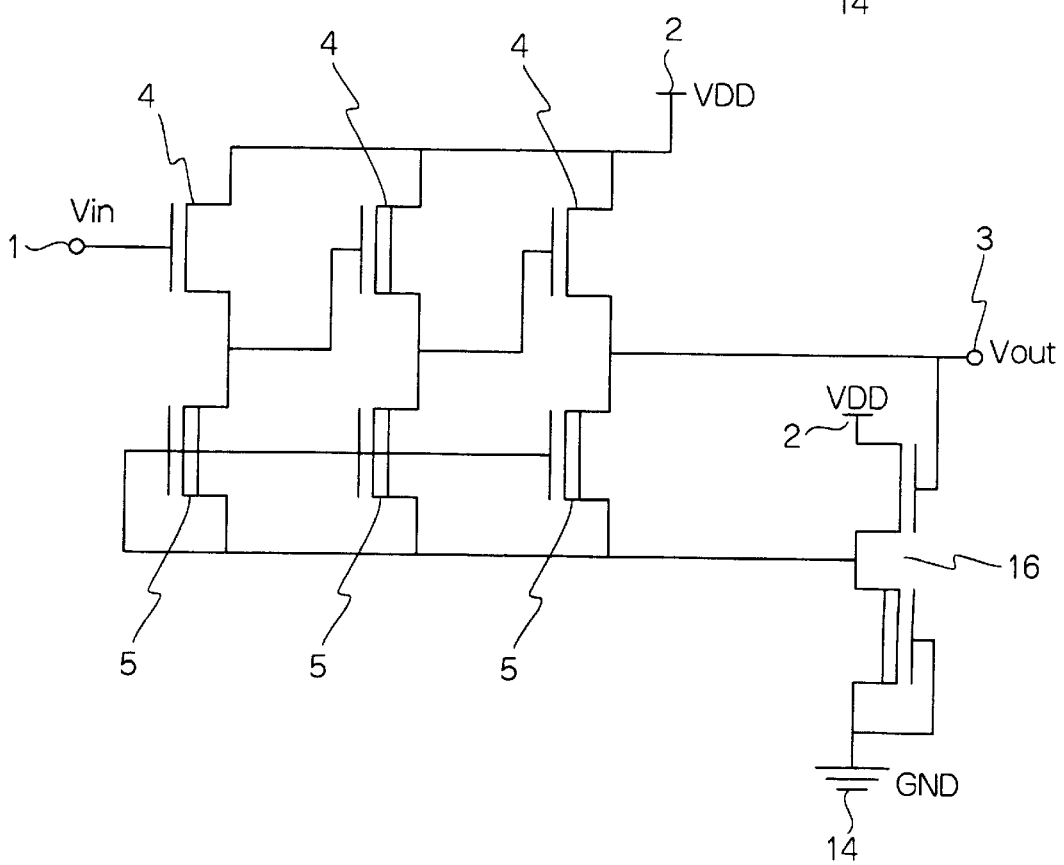
FIG. 2B shows an equivalent circuit of an amplifier in a solid-state image sensor according to a third embodiment of the present invention.

It should be noted that in the first, the second, and the third embodiments shown in FIG. 1, FIG. 2A, and FIG. 2B, respectively, the output terminal 3 may be connected to the source or the source and gate of the load transistors 5 of any of the first, the second, and the third stages of the source followers.

Moreover, the effect of the present invention can also be obtained when the gate of the load transistors 5 is connected to the output terminal 3 via the capacitor 7 or the buffer amplifier 16, or even when a DC bias is applied. In this case, there will be caused no problem if a load transistor 5 of the first, second, or third stages has its gate and source connected via the capacitor 7 or the buffer amplifier 16 to the output terminal, whereas the remaining load transistors 5 have their sources connected via the capacitor 7 or the buffer amplifier 16 to the output terminal 3 and their gates to which a DC voltage is applied.

Moreover, in the aforementioned first, the second, the third embodiments, the capacitor 7, the resistor 8, and the buffer amplifier 16 are formed on a single chip. However, they may also be formed on a separate chip to be connected externally.

Furthermore, the first, the second, and the third embodiments have been explained as a 3-stage follower, but the number of stages is not limited to three. The present invention can be applied to any source follower having one or more stages.

Moreover, the transistors constituting the source follower may be either of the surface type or the bury type.

Furthermore, the first, the second, and the third embodiments have been explained for N channel transistors. However, the present invention can also be applied to a case of P channel transistors by changing the polarity.

Moreover, the present invention can also be applied readily to an inverter having a current source.

Figure 9:
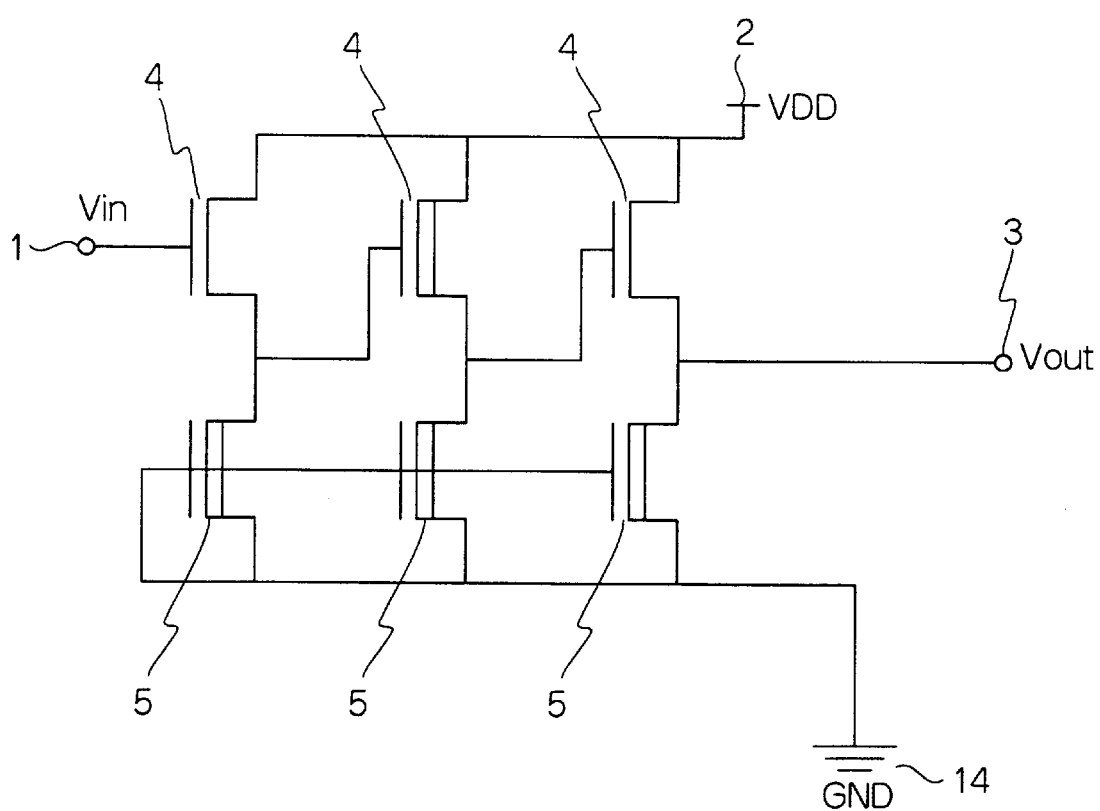
FIG. 9 shows an equivalent circuit of a single-chip source follower amplifier in a conventional typical solid-state image sensor.
Figure 10A:
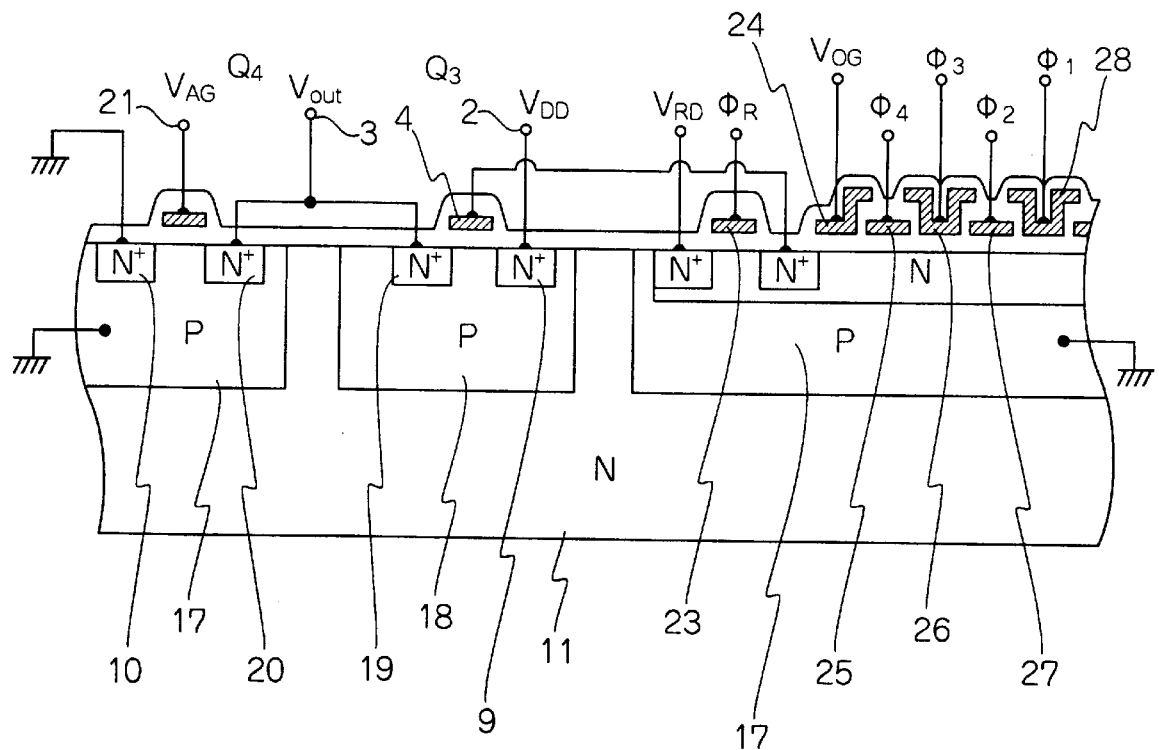
FIG. 10A is a cross sectional view of a solid-state image sensor disclosed in Japanese Patent Publication (Unexamined) No. A-60-223161 [1]
Figure 10B:
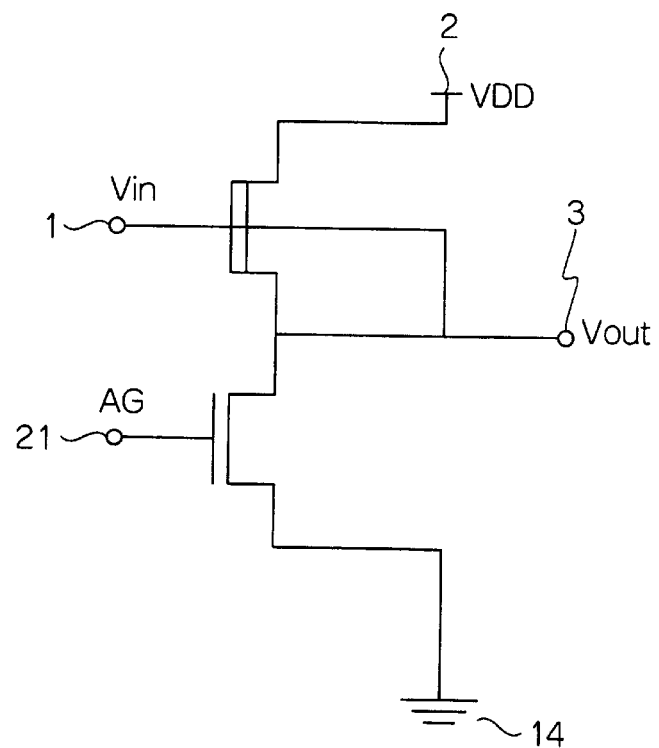
FIG. 10B shows an equivalent circuit of a single-chip source follower amplifier in the solid-state image sensor.

In order to confirm the effect of the present invention in increasing the gain, six types of solid-state image sensor amplifiers (Examples 1 to 6) were actually prepared according to the present invention. Equivalent circuits of the six examples are shown in FIG. 3A, FIG. 3B, FIG. 4A, FIG. 4B, FIG. 5A, and FIG. 5B, respectively. The gain increase obtained by each of these six solid-state image sensor amplifiers was evaluated in relation to the gain increase obtained by the conventional source follower amplifier shown in FIG. 9. The gain increase ratios of these six solid-state image sensor amplifiers are shown below in percentage.

Figure 3:
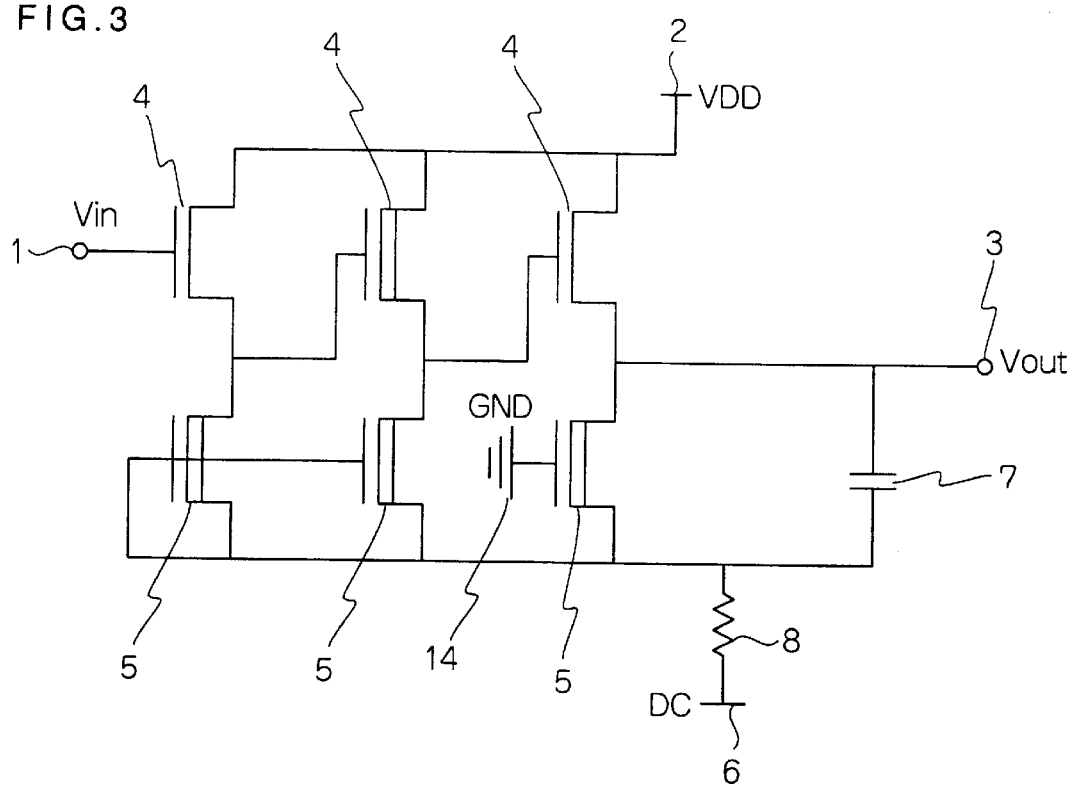
FIG. 3 shows a first example of the solid-state image sensor amplifier according to the present invention.
Figure 4:
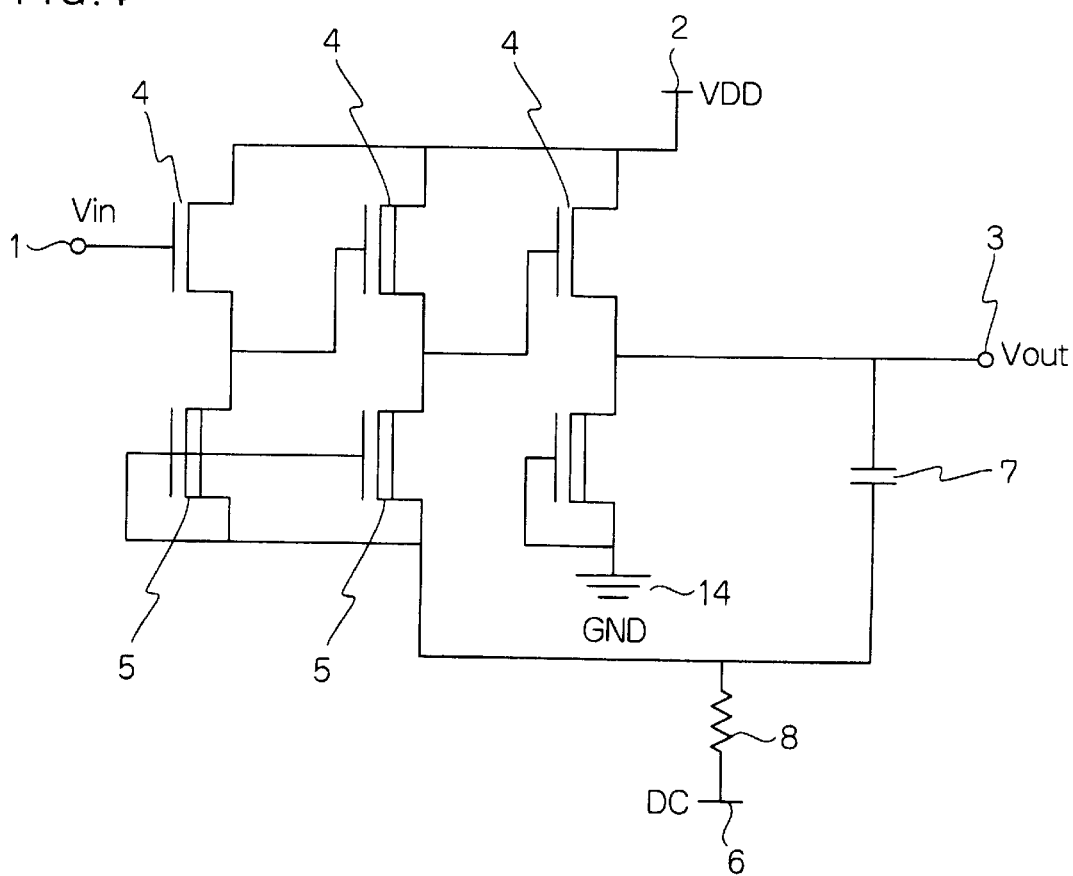
FIG. 4 shows a second example of the solid-state image sensor amplifier according to the present invention.
Figure 5:
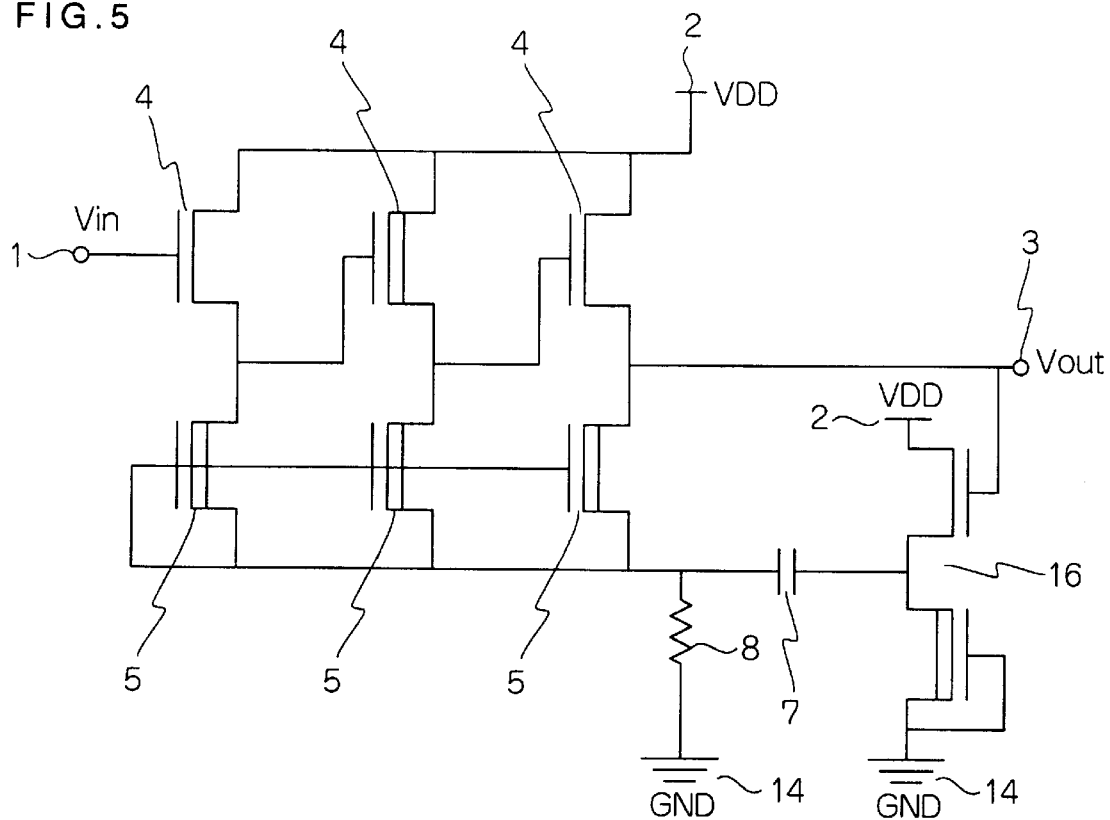
FIG. 5 shows a third example of the solid-state image sensor amplifier according to the present invention.
Figure 6:
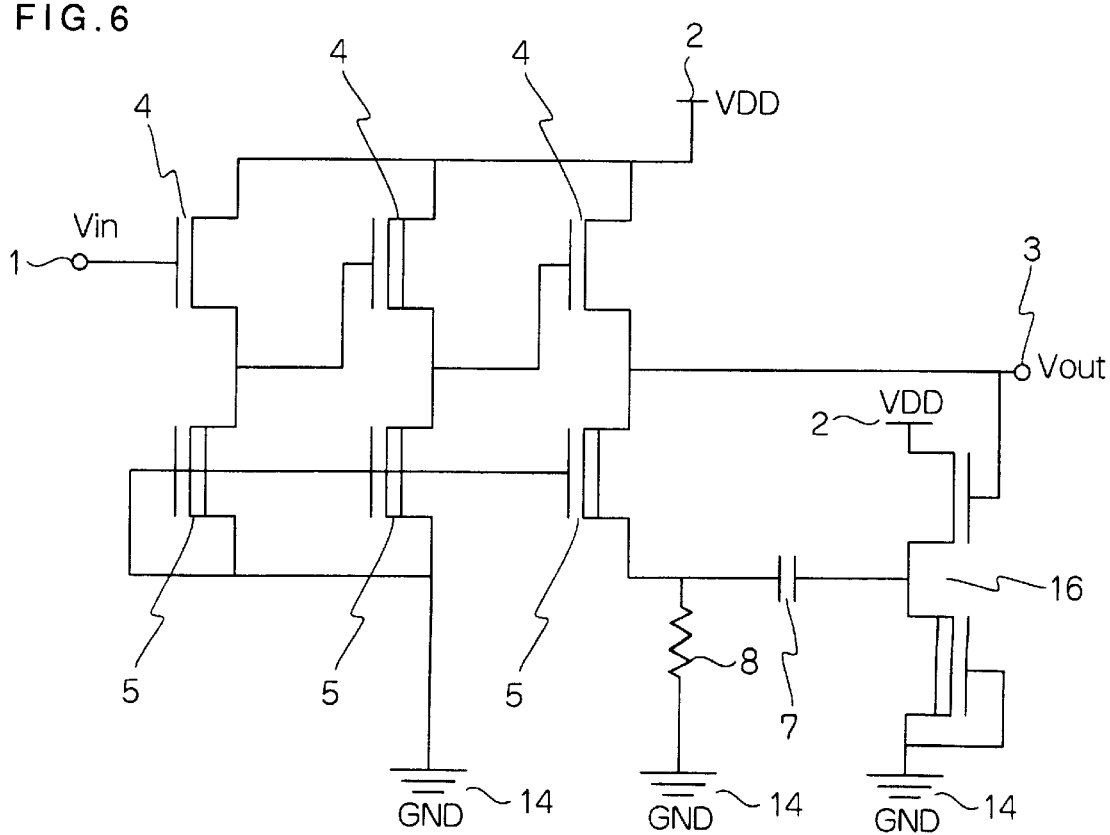
FIG. 6 shows a fourth example of the solid-state image sensor amplifier according to the present invention.
Figure 7:
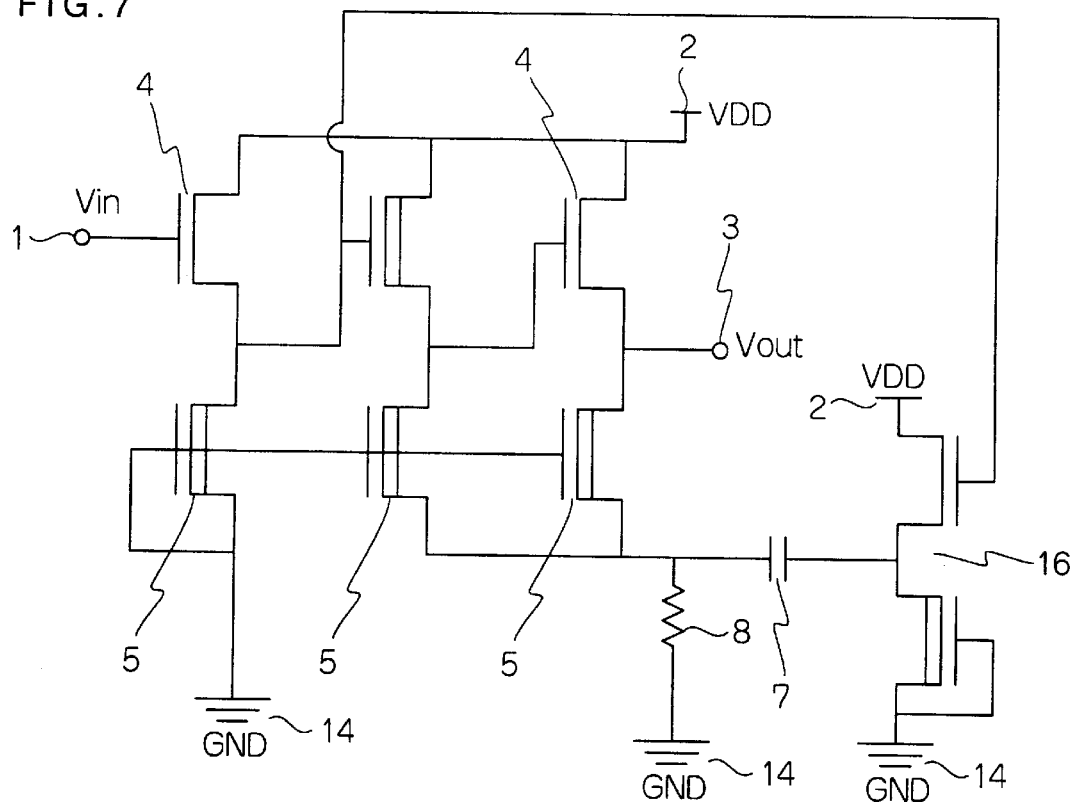
FIG. 7 shows a fifth example of the solid-state image sensor amplifier according to the present invention.
Figure 8:
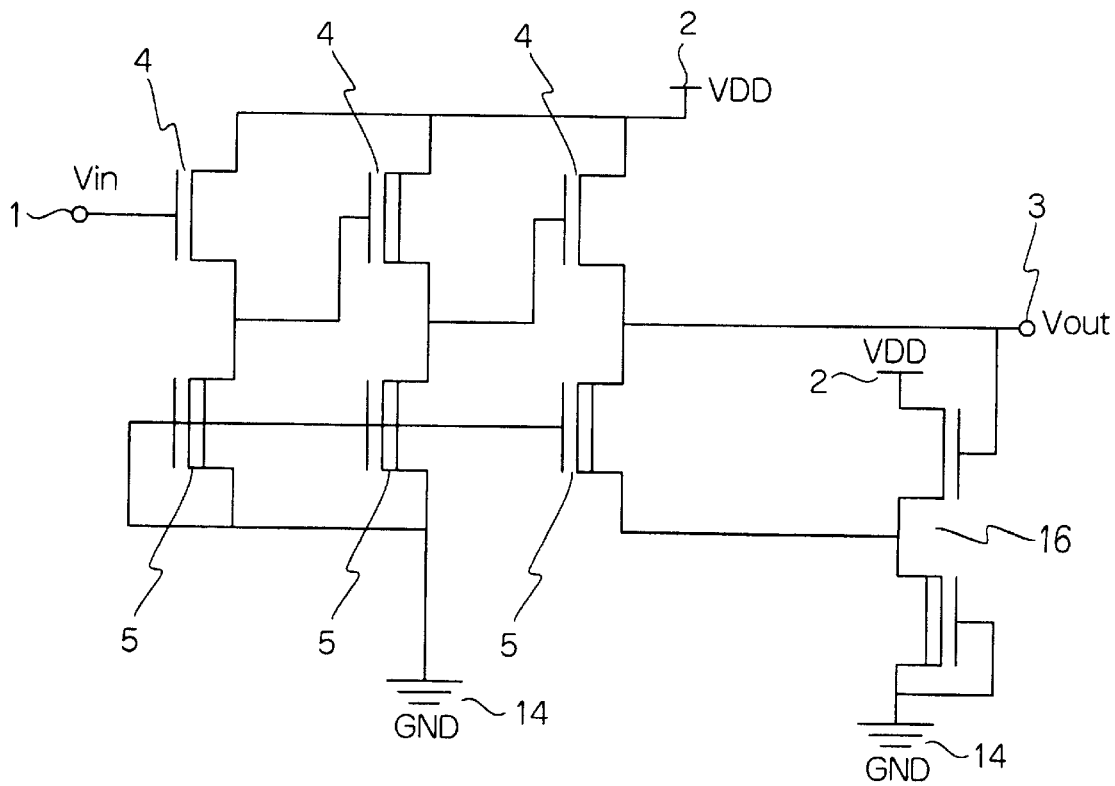
FIG. 8 shows a sixth example of the solid-state image sensor amplifier according to the present invention.

Example 1 in FIG. 3 . . . 6.3%
Example 2 in FIG. 4 . . . 9.4%
Example 3 in FIG. 5 . . . 15.6%
Example 4 in FIG. 6 . . . 21.9%
Example 5 in FIG. 7 . . . 25.0%
Example 6 in FIG. 8 . . . 25.0%

It should be noted that in these six types of solid-state image sensor amplifiers, the power voltage VDD 2 was 15 V, the capacitor 7 had a capacitance of 10000 pF, the input voltage Vin 1 was a 16 NHz waveform from 13 V to 15 V, the DC bias voltage was −10 V, and the resistor 8 had resistance values as follows.

Example 1 . . . 5 kΩ
Example 2 . . . 15 kΩ
Example 3 . . . 1 kΩ
Example 4 . . . 1 kΩ
Example 5 . . . 1 kΩ

Thus, the solid-state image sensor according to the present invention enables the prevention of a loss of gain due to the backup gate effect in the single-chip source follower amplifier so as to increase the gain.

Moreover, in the solid-state image sensor according to the present invention, unlike the solid-state image sensor disclosed in Document [2], there is no need of providing a new additional circuit such as an output reverse circuit. Furthermore, the present invention enables to reduce the size of the solid-state image sensor without increasing the transistor area like in the voltage circuit disclosed in Document [3].

The present invention may be embodied in other specific forms without departing from the spirit or essential characteristic thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

The entire disclosure of Japanese Patent Application No. 09-301700 (Filed on Nov. 4$^{th}$, 1997) including specification, claims, drawings and summary are incorporated herein by reference in its entirety.

What is claimed is:

1. A solid-state image sensor comprising a multi-stage source follower amplifier, each stage having at least one load transistor and one driver transistor, on a single chip, wherein a DC voltage is applied to a source or gate of said load transistor of the source follower amplifier of the last stage and at least one source follower amplifier of a stage prior to the last stage in said multi-stage source follower amplifier, or to a source or a source and gate of said load transistor of at least one source follower amplifier of the stage prior to the last stage in said multi-stage source follower amplifier, and an output signal from said multi-stage source follower amplifier is applied via a capacitor.

2. The solid-state image sensor as claimed in claim 1, wherein said source and said gate of said load transistor in each stage are connected to a high-resistance resistor to receive said DC voltage therethrough.

3. A solid-state image sensor comprising a multi-stage source follower amplifier, each stage having at least one load transistor and at least one driver transistor, on a single chip, wherein a source follower amplifier of at least one stage has a load transistor whose source and gate are connected via a capacitor to an output terminal of said multi-stage source follower amplifier, and at least one of remaining source follower amplifiers has a load transistor whose source is connected via said capacitor to said output terminal, so that a DC voltage is applied to a gate of said load transistor.

4. A solid-state image-sensor as claimed in claim 3, wherein said DC voltage is applied via a resistor having a high resistance.

5. A solid-state image sensor as claimed in claim 4, wherein said resistor is provided out of said chip.

6. A solid-state image sensor as claimed in claim 3, wherein said capacitor is provided out of said chip.

7. A solid-state image sensor comprising a multi-stage source follower amplifier, each stage having at least one load transistor and one driver transistor, on a single chip, wherein an output signal from said multi-stage source follower amplifier is applied via a buffer amplifier and a capacitor to a source or a source and gate of said load transistor in said multi-stage source follower amplifier.

8. A solid-state image sensor as claimed in claim 7, wherein said buffer amplifier is provided out of said chip.

9. A solid-state image sensor including a multi-stage source follower amplifier, each stage having at least one load transistor and at least one driver transistor, on a single chip, wherein a source follower amplifier of at least one stage has a load transistor whose source and gate are connected via a buffer amplifier and a capacitor to an output terminal of said multi-stage source follower amplifier, and at least one of remaining source follower amplifiers has a load transistor whose source is connected via said buffer amplifier to said output terminal, so that a DC voltage is applied to a gate of said load transistor.

10. A solid-state image sensor as claimed in claim 9, wherein said buffer amplifier is provided out of said chip.

11. A solid-state image sensor comprising multi-stage source follower amplifier, each stage having at least one load transistor and one driver transistor, on a single chip, wherein a DC voltage is applied to a source or a source and gate of at least one source follower in said multi-stage source follower amplifier, and an output signal from said multi-stage source follower amplifier is applied via a capacitor and a buffer amplifier.

12. A solid-state image sensor as claimed in claim 1, wherein said DC voltage is applied via a resistor having a high resistance.

13. A solid-state image sensor as claimed in claim 12, wherein said resistor is provided out of said chip.

14. A solid-state image sensor as claimed in claim 11, wherein said capacitor is provided out of said chip.

15. A solid-state image sensor as claimed in claim 11, wherein said buffer amplifier is provided out of said chip.

16. A solid-state image sensor including a multi-stage source follower amplifier, each state having at least one load transistor and at least one driver transistor, on a single chip, wherein a source follower amplifier of at least one stage has a load transistor whose source and gate are connected via a capacitor and buffer amplifier to an output terminal of said multi-stage source follower amplifier, and at least one of remaining source follower amplifiers has a load transistor whose source is connected via said capacitor and a buffer amplifier to said output terminal, so that a DC voltage is applied to a gate of said load transistor.

17. A solid-state image sensor as claimed in claim 16, wherein said DC voltage is applied via a resistor having a high resistance.

18. A solid-state image sensor as claimed in claim 17, wherein said resistor is provided out of said chip.

19. A solid-state image sensor as claimed in claim 16, wherein said capacitor is provided out of said chip.

20. A solid-state image sensor as claimed in claim 16, wherein said buffer amplifier is provided out of said chip.

21. A solid-state image sensor comprising a multi-stage source follower amplifier, each stage having at least one load transistor and one driver transistor, on a single chip, wherein a DC voltage is applied to a source or a source and gate of at least one source follower in said multi-stage source follower amplifier, and an output signal from said multi-stage source follower amplifier is applied via a capacitor, wherein said DC voltage is applied via a resistor having high resistance.

22. A solid-state image sensor as claimed in claim 21, wherein said resistor is provided out of said chip.

23. A solid-state image sensor comprising a multi-stage source follower amplifier, each stage having at least one load transistor and one driver transistor, on a single chip, wherein a DC voltage is applied to a source or a source and gate of at least one source follower in said multi-stage source follower amplifier, and an output signal from said multi-stage source follower amplifier is applied via a capacitor, wherein said capacitor is provided out of said chip.

* * * * *